United States Patent
Barrenscheen et al.

(10) Patent No.: US 12,212,314 B2
(45) Date of Patent: Jan. 28, 2025

(54) COMMON MODE EVALUATION

(71) Applicant: Infineon Technologies AG, Neubiberg (DE)

(72) Inventors: Jens Barrenscheen, Munich (DE); Marcus Nuebling, Olching-Esting (DE); Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 205 days.

(21) Appl. No.: 18/046,396

(22) Filed: Oct. 13, 2022

(65) Prior Publication Data

US 2024/0128973 A1   Apr. 18, 2024

(51) Int. Cl.
| | |
|---|---|
| *H02P 27/08* | (2006.01) |
| *H02M 1/08* | (2006.01) |
| *H02M 1/38* | (2007.01) |
| *H03K 17/687* | (2006.01) |
| *H03K 17/689* | (2006.01) |

(52) U.S. Cl.
CPC .......... *H03K 17/6871* (2013.01); *H02M 1/08* (2013.01); *H02M 1/38* (2013.01); *H02P 27/08* (2013.01); *H03K 17/689* (2013.01)

(58) Field of Classification Search
CPC .. H03K 17/6871; H03K 17/689; H03K 17/78; H02M 1/08; H02M 1/38; H02P 27/08
See application file for complete search history.

(56) References Cited

U.S. PATENT DOCUMENTS

| | | | | |
|---|---|---|---|---|
| 8,009,055 | B2* | 8/2011 | Lindsey | G01R 19/16542 340/662 |
| 8,963,622 | B2* | 2/2015 | Lee | H02M 3/33523 327/530 |
| 9,735,773 | B2* | 8/2017 | McIntosh | H02P 31/00 |
| 10,324,144 | B2* | 6/2019 | Gruber | G01R 33/093 |
| 10,587,262 | B1* | 3/2020 | Morini | H03K 17/165 |
| 10,707,857 | B2* | 7/2020 | Evans | H03K 17/04206 |

(Continued)

OTHER PUBLICATIONS

"ISO72x Single Channel High-Speed Digital Isolators", Texas Instruments, Jan. 2006, 36 pp.

(Continued)

*Primary Examiner* — Rina I Duda
(74) *Attorney, Agent, or Firm* — Shumaker & Sieffert, P.A.

(57) ABSTRACT

A system including circuitry to communicate data across an isolation barrier of a switch driver circuit. For switch driver circuits with galvanic isolation, the circuitry of this disclosure uses the unavoidable common mode voltages caused by the coupling capacitances of the data transfer circuit to evaluate the common mode voltage characteristics, such as the slew rate of a switching event. The switch driver circuit of this disclosure may include a common mode voltage detector to detect and measure features of the unavoidable common mode voltage during a switching event, such as voltage amplitude and slew rate. The common mode voltage detector may couple to a communication interface that provides the common mode voltage information to a controller for the switch driver circuit. In some examples, based on the received information, the controller may adjust the operation of the switching circuit.

19 Claims, 6 Drawing Sheets

(56) References Cited

U.S. PATENT DOCUMENTS

| | | | | |
|---|---|---|---|---|
| 10,862,399 | B1* | 12/2020 | Rai | H02M 3/33515 |
| 11,146,341 | B1* | 10/2021 | Nuebling | H04B 1/40 |
| 2015/0054435 | A1* | 2/2015 | Silitonga | H02P 29/10 |
| | | | | 318/400.04 |
| 2015/0063434 | A1* | 3/2015 | Sonntag | H04L 25/4902 |
| | | | | 375/238 |
| 2018/0026557 | A1* | 1/2018 | Paschedag | H02P 27/08 |
| | | | | 318/445 |
| 2021/0159898 | A1* | 5/2021 | Westwick | H02M 1/08 |

OTHER PUBLICATIONS

"Peak Detector"; Basic Electronics Tutorials; Retrieved from: https://www.electronics-tutorial.net/analog-integrated-circuits/peak-detector/; Accessed on Oct. 12, 2022; 3 pp.

"Power Supply Design Notes: hard switching and Soft switching to reduce losses", Power Electronic News, Dec. 13, 2020, 6 pp.

"Understanding Common Mode Noise"; Pulse A Yageo Company; Retrieved from https://www.pulseelectronics.com/wp-content/uploads/2021/01/Pulse-Power-BU-Understanding-Common-Mode-Noise.pdf; Accessed on Oct. 12, 2022; 6 pp.

"Understanding Common-Mode Signals"; Maxim Integrated; Retrieved from https://www.maximintegrated.com/en/design/technical-documents/tutorials/2/2045.html.; Accessed on Oct. 12, 2022; 6 pp.

"ADuM1100"; Data Sheet, Analog Devices Inc.; Retrieved from: https://www.analog.com/media/en/technical-documentation/data-sheets/adum1100.pdf; Accessed on Oct. 12, 2022; 20 pp.

Gingerich, "ISO72x Digital Isolator Magnetic-Field Immunity", Texas Instruments, Jan. 2006, 7 pp.

Kaeriyama et al., "A 2.5 kV Isolation 35 kV/us CMR 250 Mbps Digital Isolator in Standard CMOS With a Small Transformer Driving Technique", IEEE journal of solid-state circuits, vol. 47, No. 2, Feb. 2012, pp. 435-443.

Yun et al., "A Transformer-based Digital Isolator with 20kVPK Surge Capability and >200kV/μS Common Mode Transient Immunity", IEEE Symposium on VLSI Circuits, Jun. 15, 2016, 2 pp.

* cited by examiner

COMMON MODE EVALUATION

TECHNICAL FIELD

The disclosure relates to operation of power switching circuits.

BACKGROUND

Power switch driver circuits may control the operation of power switches, such as switches in a power inverter circuit. Some examples of power switches may include metal oxide semiconductor field effect transistors (MOSFET), insulated gate bipolar junction transistors (IGBT) and similar power semiconductors. Power switch driver circuits may also communicate with other components of a system, such as a controller for the system. Some examples of communication data transfer may include configuration parameters for operation of the switching circuit such as temperature limits, current limits, or other operating parameters. In some examples, communication may pass across an isolation barrier.

SUMMARY

In general, the disclosure describes techniques to communicate data across an isolation barrier of a switch driver circuit. For switch driver circuits with galvanic isolation, the circuitry of this disclosure uses the unavoidable common mode voltages caused by the coupling capacitances of the data transfer circuit to evaluate the common mode voltage characteristics, such as the slew rate of a switching event. The switch driver circuit of this disclosure may include a common mode voltage detector to detect and measure features of the unavoidable common mode voltage during a switching event, such as amplitude and speed. The common mode voltage detector may couple to a communication interface that provides the common mode voltage information to a controller for the switch driver circuit. In some examples, based on the received information, the controller may adjust the operation of the switching circuit, e.g., by controlling the switch driver circuit. For example, based on the detected slew rate over known coupling series capacitance (Cs), the controller may adjust the configuration for switching speed. Also, based on the occurrence of a switching, detected by measuring the common mode voltage, the controller may adjust timing, e.g., adapt dead-time between high-side (HS) and low-side (LS) switches, or as input for a motor control algorithm or other load powered by the switching circuitry.

In one example, this disclosure describes a circuit comprising: power switch driver circuitry including: galvanic isolation, including a coupling component; on a first side of the galvanic isolation, first connections configured to operatively connect to a controller; and on a second side of the galvanic isolation, second connections configured to operatively connect to a power switch control terminal; a data transfer circuit comprising: the coupling component, the coupling component configured to conduct communication between the first side and the second side of the galvanic isolation; and a common mode voltage detector circuit, wherein the common mode detector circuit is configured to: measure characteristics of a common mode voltage at the data transfer circuit, wherein the common mode voltage is a result of a switching event of a power switch controlled by the power switch control terminal.

In another example, this disclosure describes a system comprising: a controller including processing circuitry; and power switch driver circuitry comprising: galvanic isolation, including a coupling component; on a first side of the galvanic isolation, first connections configured to operatively connect to the controller; and on a second side of the galvanic isolation, second connections configured to operatively connect to a power switch control terminal; a data transfer circuit comprising: the coupling component, the coupling component configured to conduct communication between the first side and the second side of the galvanic isolation; and a common mode voltage detector circuit, wherein the common mode detector circuit is configured to: measure characteristics of a common mode voltage at the data transfer circuit, wherein the common mode voltage is a result of a switching event of a power switch controlled by the power switch control terminal.

In another example, this disclosure describes a method comprising: measuring a common mode voltage at a data transfer circuit of a power switch driver circuit, wherein the data transfer circuit is configured to communicate across a galvanic isolation boundary, wherein the galvanic isolation boundary isolates a first side of a power switch driver circuit from a second of the power switch driver circuit wherein the first side of the power switch driver circuit connects to a controller comprising processing circuitry, and wherein the second side of the power switch driver circuit connects to a power switch; sending, by the power switch driver circuit, a signal comprising data based on the measured common mode voltage; and controlling, by the power switch driver circuit, operation of the power switch driver circuit based on the data.

The details of one or more examples are set forth in the accompanying drawings and the description below. Other features, objects, and advantages will be apparent from the description, drawings, and claims.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure describes techniques to communicate data across an isolation barrier of a switch driver circuit using a coupling component of the isolation barrier. In the example of galvanic isolation, which may be implemented using capacitors to provide the isolation or by using a transformer to provide the isolation, the coupling component may include a capacitor. For the transformer, the coupling capacitor may be a parasitic capacitor between the primary and secondary coils of the transformer. The switch driver circuit may include a data transfer circuit, including the coupling components, that conducts communication between the first side and the second side of the galvanic isolation. The switch driver circuit may also include a common mode voltage detector circuit, wherein the common mode detector circuit is configured to measure characteristics of the unavoidable common mode voltages on the coupling capacitances of the data transfer circuit. The common mode voltage may be a result of a switching event of a power switch controlled by the power switch control terminal.

Figure 1:
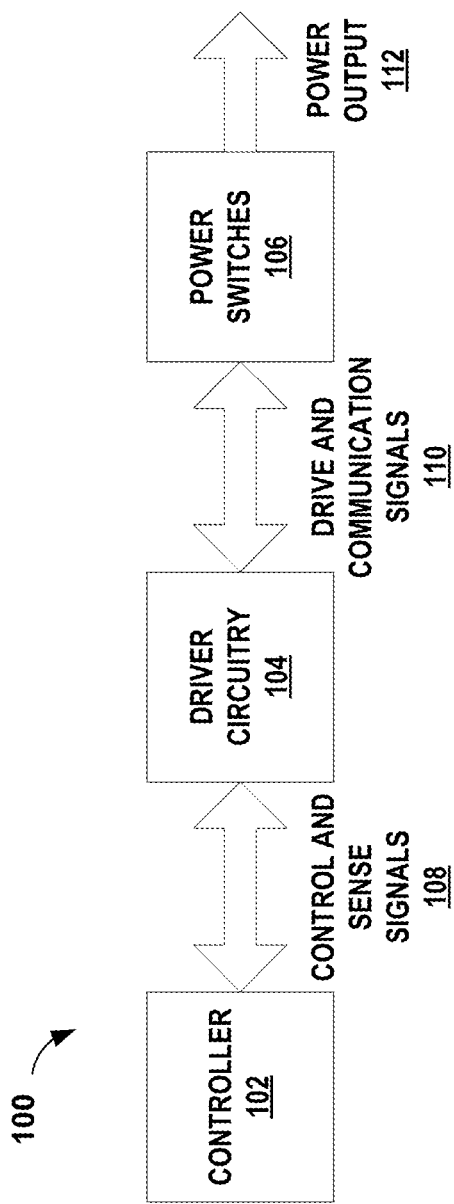
FIG. 1 is a block diagram illustrating an example power switching system according to one or more techniques of this disclosure.

FIG. 1 is a block diagram illustrating an example power switching system according to one or more techniques of this disclosure. In the example of FIG. 1, system 100 includes controller 102, which may send control signals to driver circuitry 104. Controller 102 may also receive sense and status signals from driver circuitry 104.

Driver circuitry 104 may send drive signals, and communication signals 110, to power switches 106. Driver circuitry 104 may also receive communication signals 110 from power switches 106. Some examples of communication signals 110 may include switching configuration commands to power switches 106, and status data from power switches 106, such as switch state (ON or OFF), temperature from a temperature sensor, and similar communication signals.

Driver circuitry 104 may include an isolation barrier to isolate controller 102 from the high voltages and electromagnetic interference (EMI) caused by power switch transitions of system 100. The isolation barrier of driver circuitry 104 may be implemented as galvanic isolation described above. Driver circuitry 104 may also include the data transfer circuit with the coupling component configured to conduct the communication between the first side and the second side of the galvanic isolation (not shown in FIG. 1).

Power switches 106 may control power output 112 to a load, such as to a motor, lighting, and similar loads. In some examples power switches 106 may provide power conversion, e.g., DC-DC converter, inverter and similar power conversion. Power switches 106 may include full bridge, half-bridge and similar circuits with metal oxide semiconductor field effect transistors (MOSFET), insulated gate bipolar junction transistors (IGBT) or other powers switches and may be implemented with a variety of technologies including silicon carbide (SiC), gallium nitride (GaN) or other technologies.

Examples of controller 102 may include for an engine control unit (ECU), body control unit (BCU), motor driver or other applications. Controller 102 and driver circuitry 104 may include processing circuitry such as any one or more of a microcontroller (MCU), e.g. a computer on a single integrated circuit containing a processor core, memory, and programmable input/output peripherals, a microprocessor (µP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry.

Examples of a memory associated with controller 102 and/or driver circuitry 104 may include any type of computer-readable storage media such as random access memory (RAM), read only memory (ROM), programmable read only memory (PROM), erasable programmable read only memory (EPROM), one-time programmable (OTP) memory, electronically erasable programmable read only memory (EEPROM), flash memory, or another type of volatile or non-volatile memory device. In some examples the computer readable storage media may store instructions that cause the processing circuitry to execute the functions described herein. In some examples, the computer readable storage media may store data, such as configuration information, temporary values and other types of data used to perform the functions of this disclosure.

Figure 2:
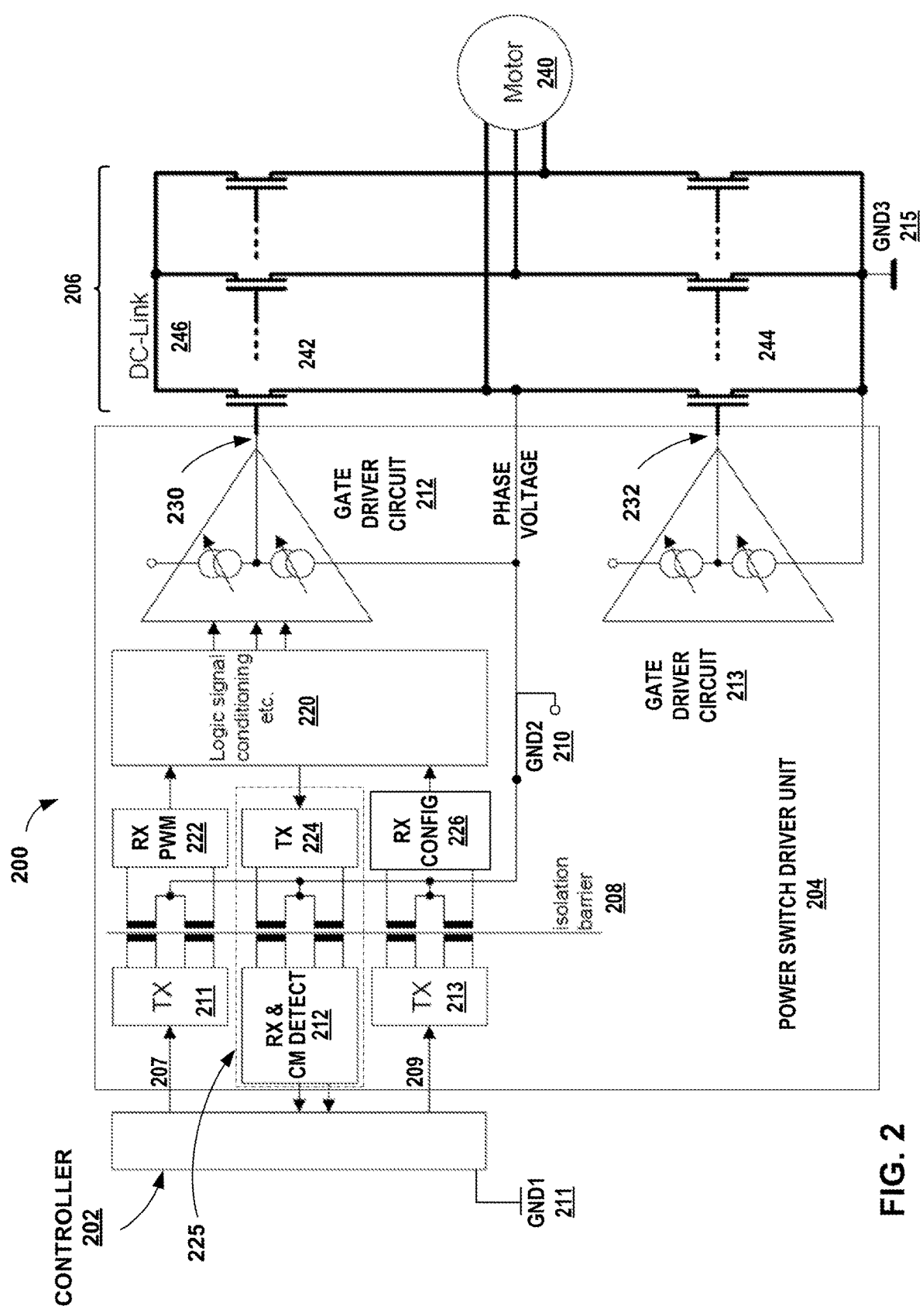
FIG. 2 is a schematic diagram illustrating a power switching system a communication and common mode detection circuit according to one or more techniques of this disclosure.

FIG. 2 is a block diagram illustrating a power switching system a common mode detection circuit according to one or more techniques of this disclosure. System 200 is an example of system 100 described above in relation to FIG. 1. In the example of FIG. 2, system 200 includes controller 202, which may send control signals 208 and configuration commands 209 to power switch driver unit 204. Power switch driver unit 204 is circuitry that includes gate driver circuits for each of the power switches in power switches 206, such as gate driver circuits 212 and 213, as well as logic and signal conditioning circuitry 220 and the communication circuitry and isolation barrier 208. Controller 202 may also receive sense and status signals from power switch driver unit 204, such as via data transfer circuit 225. Controller 202 is an example of controller 102 described above in relation to FIG. 1 and has the same or similar functions and characteristics.

In the example of FIG. 2, power switch driver unit 204 receives commands from controller 202 and controls the operation of the three-phase of power switching circuit 206 to control three-phase motor 240. Power switching circuit 206 may also be referred to as power switches 206 in this disclosure. The communication circuitry of power switch driver unit 204 each includes an isolation barrier, indicated by isolation barrier 208. In the example of FIG. 2, isolation barrier 208 is implemented as a differential transformer. In other examples isolation barrier 208 may be implemented as other types of galvanic isolation, e.g., as capacitive isolation, a single transformer rather than a differential transformer, or some other type of isolation barrier that includes a capacitive coupling component, as described above in relation to FIG. 1.

Controller 202 may control the operation of power switches 206 with switching commands 207. Switching commands 207 may include pulse-width or pulse density modulated switching commands, such as edge-aligned or center-aligned pulse width modulation, pulse frequency modulation, or other modulation schemes to control the operation of motor 240. Transmit circuit, TX 211 may receive switching commands 207 and communicate to a power switch, e.g., power switch 242 of power switches 206 via receive circuit RX PWM 222, logic and signal conditioning 220 and gate driver circuits 212 and 213. For clarity, FIG. 2 only shows gate driver circuits 212 (for one high-side power switch 242 of one phase of power switch unit 206) and 213 (for one low-side power switch 244 of one phase of power switch unit 206). However, power switch driver unit 204 may also include gate driver circuits for the other two phases of power switches 206. Controller 202 may also send configuration commands 209 to control switching operation via transmit circuit TX 213 and receive circuit RX config 224.

In the example of FIG. 2, power switch driver unit 204 connects to the gate, e.g., the control terminal, of each switch of power switch unit 206, on the opposite side of isolation barrier 208 from controller 202. The reference potential for the driver side of isolation barrier 208 is GND2 210 in the example of FIG. 2. The reference potential for the controller side of isolation barrier 208 is GND1 211, which may be at a different voltage potential from GND2 210. GND2 210 may also be described as the phase voltage for motor 240, because gate driver circuit 212 refers to a high-side switch and GND2 210 is connected to a terminal of motor 240. GND3 is the reference potential for power switches 206 and has a voltage potential that may differ from either of GND1 209 and GND2 210. Power switch 206 may be supplied by a so-called DC-Link voltage 246. In some examples, the DC-Link voltage may be in the range between 400V to 800V. In automotive applications, such high voltages have to be isolated from chassis ground of the vehicle. In typical automotive applications, the ground for controller 202 may refer to chassis ground of the vehicle. If data has to be exchanged between these different voltage domains, the difference between the reference potentials requires a separation of the circuit parts, for example by an isolation barrier, e.g., isolation barrier 208. Depending on the relation of the different reference voltages, a galvanic isolation may be used as isolation barrier in one example, whereas in another example, a level-shifter based isolation may be sufficient.

The isolation barriers separate the parts of the system 200, according to their reference potentials. For example, one side of isolation barrier 208 refers to the reference potential of the controller 202, GND1 211. This side may be called "primary side". The other side of isolation barrier 208 refers to the reference potential of power switch 242, GND2 210. This side may be called "secondary side". Some data may be transferred from the primary side to the secondary side by using a data transmitter (TX) on the primary side and a data receiver (RX) on the secondary side, like TX 211 and RX 222. Other data may be transferred from the secondary side to the primary side by using a data transmitter (TX) on the secondary side and a data receiver (RX) on the primary side, like TX 224 and RX 212.

There are different types of coupling components available to build a communication channel bridging a galvanic isolation barrier, such as opto-electronic couplers, magnetic/inductive couplers, capacitive couplers, and similar components. Each type of these coupling components has specific properties, e.g., relating to aging, temperature dependencies, EMI robustness, power consumption, latency, bandwidth, coupling capacitance, and other properties and may be selected according to the application. An example parameter of a coupling component is the resulting coupler capacitance between the primary side and the secondary side.

A data transfer circuit may comprise a combination of a data transmit circuit TX and a receive circuit RX, connected together via a coupling component to allow data transfer over an isolation barrier. Data transfer circuit 225 may deliver information to controller 202, which may include data from power switch driver unit 204, such as switching status, overvoltage or over current alarms, circuit temperature, and other information. In the example of FIG. 2, the transmit circuitry, TX 224, of data transfer circuit 225 is on the secondary side of isolation barrier 208 while the receive circuitry, RX 212, is on the primary side of isolation barrier 208, e.g., the same side as controller 202. However, another data communication circuit may also be arranged in the opposite direction, e.g., with Tx 211 receiving data from controller 202, sending data across isolation barrier 208 to RX 222.

In addition to a transmit circuit TX and a receive circuit RX, a communication circuit may include common mode detector circuit 212, detecting a common mode voltage. In this example, a common mode detector circuit is located close to the differential receiver circuit RX of the communication circuit. A common mode voltage is introduced in the differential input signals of receiver circuit due to the coupling capacitance if the relation between the reference potentials of the primary side and of the secondary side change. The higher the coupling capacitance or the faster the change of the reference potentials with respect to each other, the higher gets the resulting common mode voltage. The direction of the CM voltage (positive or negative) depends on the direction of the change, e.g., for an increasing or a decreasing voltage difference.

The change of a reference potential may be due to a switching event of power switches. For example, at a first point in time, high side switch 242 may be conducting and low side switch 244 may be switched off. In this case, reference potential 210 for gate driver circuit 212 is connected to the positive supply rail of the DC-link. At a second point in time, low side switch 244 may be conducting and high side switch 242 may be switched off. In this case, reference potential 210 for gate driver circuit 212 is connected to the negative supply rail of the DC-link. The speed of the change of a reference potential is called slew rate.

In the example of system 200, RX and CM detector circuit 212, during circuit operation measures characteristics of a common mode voltage at data transfer circuit 225. As described above the common mode voltage may be a result of switching events of a power switches 206 controlled by the power switch control terminal, e.g., gate 230 or gate 232 of switch 242 and 244 respectively. RX and CM detector circuit 212 may also deliver information to controller 202, which may include data from logic circuit 220, one or more sensors, e.g., a temperature sensor (not shown in FIG. 2) of power switch driver unit 204 as well as data based on the measured characteristics of the common mode voltage. The data sent to controller 202 may include the slew rate over time of the switching operation of power switch driver unit 204 and switches 206. In some examples, slew rate may be defined as dV/dt, with V referring to the difference of the reference potentials on both sides of the isolation barrier. With the slew rate over time, processing circuitry of controller 202, or of power switch driver unit 204, e.g., of RX and CM detector circuit 212, may calculate a variety of other characteristics which may provide information about the operation of switches 206, motor 240 and power switch driver unit 204. For example, a period of time in which dV/dt is constant may indicate the timing for a switching event of one of switches 206. The circuitry of system 200 may further calculate an average dV/dt, a peak dV/dt, the time of peak dV/dt, and other determine similar characteristics based on the measured slew rate over time. The slew rate may be described as a characteristic of the switching event.

A reaction to a detected common mode voltage may happen on either side of the isolation barrier. In the example of FIG. 2, circuit 212 may measure characteristics of a common mode voltage at data transfer circuit 225 caused by a switching event of a power switch controlled by the power switch control terminal. As shown in FIG. 2, circuit 212 may output a signal to controller 202 comprising data based on the measured characteristics of the common mode voltage. As noted above, in some examples, controller 202 may adjust operation of, the power switch driver circuitry, e.g., power switch driver unit 204, based on received data from the common mode voltage detector circuit.

In other examples, such as where the common mode detector circuit is located on the secondary side of isolation barrier 208 (not shown in FIG. 2), when the secondary side common mode detector detects a high common mode voltage, the common mode detector circuit may output data based on the measured characteristics of the common mode voltage to processing circuitry of the power switch driver circuitry, e.g., logic and signal conditioning circuitry 220. In turn logic and signal conditioning circuitry 220 may change the driver configuration to a default configuration, or otherwise adjust the operation of power switch driver unit 204 based on the data, in some examples, without the intervention of controller 202. In some examples, a power switch driver unit of this disclosure may have a combination of common mode detection circuits on both the primary and secondary side.

Figure 3A:
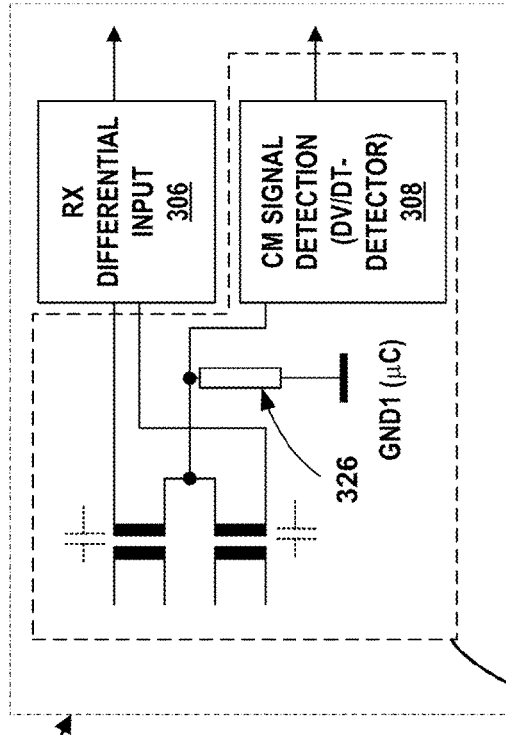
FIGS. 3A-3C are block diagrams illustrating example communication and common mode detector circuit arrangements according to one or more techniques of this disclosure.
Figure 3B:
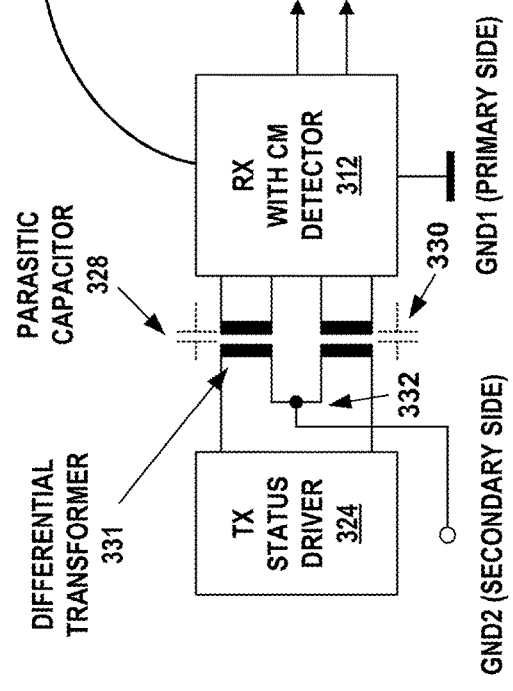
Figure 3C:
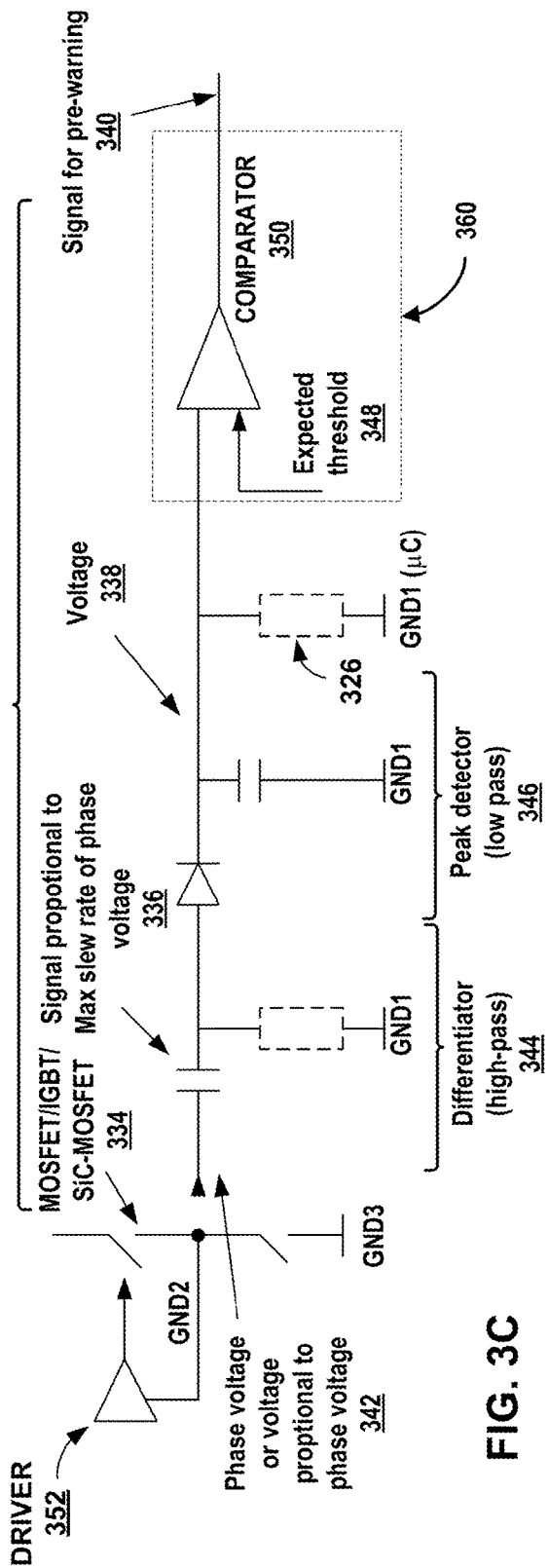

FIGS. 3A-3C are block diagrams illustrating example communication and common mode detector circuit arrangements according to one or more techniques of this disclosure. FIG. 3A illustrates an example data transfer circuit, which is an example of data transfer circuit 225 described above in relation to FIG. 2 and has the same or similar functions and characteristics. The data transfer circuit of FIG. 3A includes a TX driver 324 for status data, differential transformer 331 with parasitic coupling components 328 and 330, along with the magnetic coupling from the transformer coils, and a receiver and common mode detector 312.

In the example of FIG. 3A center tap 332 of differential transformer 331, and TX driver 324 are shown as connected to GND2, e.g., the phase voltage node. RX with CM detector 312 connects to the controller reference potential, GND1. Therefore in FIG. 3A, RX with CM detector 312 is on the same side of the galvanic isolation barrier as the controller, e.g., controller 202, as described above in relation to FIG. 2. However, in other examples, the data transfer circuit of FIG. 3A may be reversed and instead TX driver 324 may connect to the primary side and GND 1 (not shown in FIG. 3A), as described above in relation to FIG. 2.

FIG. 3B is a schematic diagram illustrating an example implementation of RX with CM detector 312. The example of FIG. 3B includes RX differential input 306, which may receive data from TX driver 324, e.g., status indications, over current alarm, and similar operation data as described above in relation to FIGS. 1 and 2. The data transfer circuit of FIGS. 3A and 3B use the coupling components, including parasitic capacitors 328 and 330, to conduct communication between the first side and the second side of the galvanic isolation provided by differential transformer 331. Parasitic capacitors 328 and 330 may produce a common mode disturbance during a switching event, as described above. The center tap on the primary side of transformer 331 connects to GND1 through resistor 326 and to CM signal detector 308. The circuitry of CM signal detector 308 may include circuitry that will detect common mode voltage in a positive direction as well as detect common mode voltage in a negative direction.

FIG. 3C is a schematic diagram illustrating an example implementation a common mode signal detection circuit, e.g., a dV/dt detector circuit, according to one or more techniques of this disclosure. The schematic in the example of FIG. 3C illustrates just one possible implementation of a common mode voltage detector circuit of this disclosure. In other examples, common mode voltage detector circuit 314 of this disclosure may include more or fewer components and may be arranged in a different manner than shown in FIG. 3C. The example of FIG. 3C includes driver 352 operatively connected to a power switch control terminal of power switch 334, which may be any power switch, such as a MOSFET, IGBT, SiC-MOSFET and similar power switches.

In the example of FIG. 3C, the input to the common mode voltage detector circuit measures the effect of a changing phase voltage 342, or a voltage proportional to the phase voltage coupled as common mode voltage to the inputs of the common mode detector via the parasitic elements 328 and 330, e.g., via a resistor divider (not shown in FIG. 3C). The input to the common mode voltage detector circuit connects to a differentiator 344, implemented as a high pass filter with a capacitor and resistor, the resistor connected to GND1. The output of differentiator 344 is a signal 336 proportional to the slew rate of phase voltage 342. A low-pass peak detector 346, implemented with a diode and a storage capacitor connected to GND1 receives the output of differentiator 344 and outputs a voltage 338 proportional to the maximum of the slew rate of the phase voltage to comparator 350. The circuit of FIG. 3C may also include a reset circuit including one or more switches (not shown in FIG. 3C) to reset peak detector 346. In other examples, with a slightly changed arrangement of the components, circuit 314 may output a voltage proportional to the slew rate integrated over time. Comparator 350 may output a pre-warning signal 340 when the integrated slew rate satisfies an expected threshold 348.

In other examples, block 360, that includes comparator 350 and threshold 348 in the example of FIG. 3B, may be replaced by an analog-to-digital converter (ADC). The ADC may receive voltage 338 and provide a digitized indication of voltage 338 to perform the same functions as described above, e.g., to obtain a maximum of the slew rate of the phase voltage, a voltage proportional to the slew rate integrated over time, as well as other functions.

As described above in relation to FIGS. 1 and 2, the common mode voltage detector circuit of this disclosure takes advantage of the unavoidable common mode voltages caused by the coupling capacitances 328 and 330 of the data transfer circuit to evaluate the common mode voltage characteristics, such as the slew rate (dV/dt) of a switching event. Also, based on the detected dV/dt, the controller, or circuit 312, may calculate other characteristics of the common mode signal, such as an average, switch timing of switch 334, peak dV/dt and similar characteristics. For example, a dV/dt that exceeds a threshold slew rate may indicate that the switches, or other components are operating in a stress region, e.g., with a slew rate that may shorten the life of the component, or may generate more EMI than desired. Based on the measured common mode voltage characteristics, the controller may output configuration commands to adjust the slew rate or other operating characteristics. The measured common mode voltage characteristics may also provide an indication of system malfunction such as an over-voltage, over-current, undesired operation for a motor, or other load, or some other malfunction.

Figures 4A, 4B:
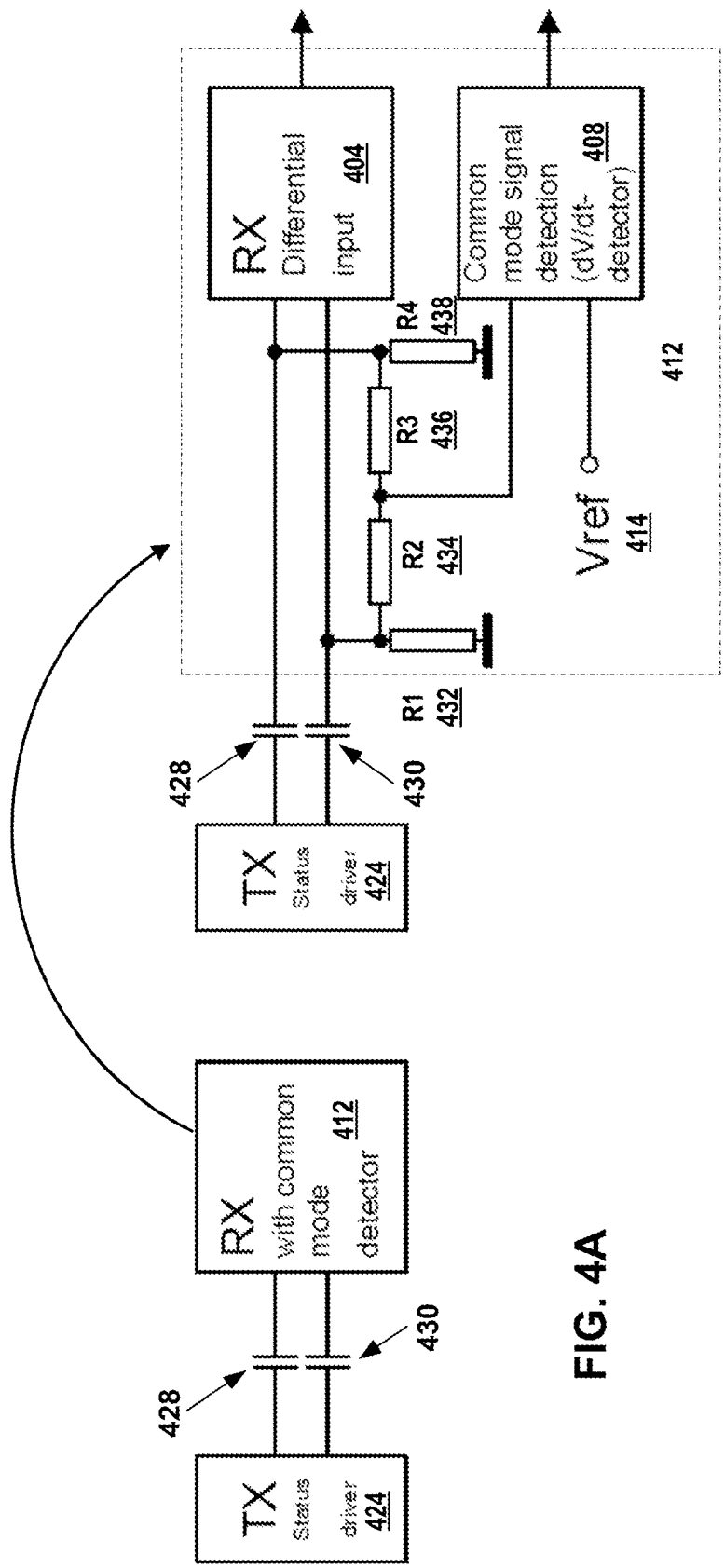
FIGS. 4A and 4B are schematic and block diagrams illustrating an example communication and common mode detector circuit for use with capacitive isolation, according to one or more techniques of this disclosure.

FIGS. 4A and 4B are block diagrams illustrating an example communication and common mode detector circuit for use with capacitive isolation, according to one or more techniques of this disclosure. The examples of FIGS. 4A and 4B may replace differential transformer based data transfer circuit 225 described above in relation to FIG. 2. In the examples of FIGS. 4A and 4B, the galvanic isolation includes capacitors 428 and 430, and the capacitors act as the coupling component to conduct communication between the first side and the second side of the galvanic isolation.

Without the center tap from the differential transformer, described above in relation to FIGS. 2 and 3, the data transfer circuits of FIGS. 4A and 4B may also include a resistor divider circuit with the common mode voltage detector circuit 408 connected to the resistor divider. The resistor divider of FIGS. 4A and 4B may also be described as a "resistive divider" when the components, e.g., R1 432, R2 434, R3 436 and/or R4 438, include some reactive impedance such as capacitance or inductance. As described above in relation to FIG. 3C, common mode voltage detector circuit 408 may also include a peak detector and one or more filter structures (not shown in FIGS. 4A and 4B). Common mode voltage detector circuit 408, and digital communication interface circuitry, e.g., RX differential input 404, are operationally connected to the controller as described above in relation to FIGS. 1 and 2.

As shown in the example of FIG. 4B, the input to common mode voltage detector circuit 408 connects to a node between resistors R2 434 and R3 436. The opposite terminal for R2 434 connects to capacitor 430 and to a local ground through resistor R1 432. The local ground may be GND1, the primary side reference potential, or GND2, the secondary side reference potential, as described above in relation to FIGS. 1-3C. The opposite terminal for R3 436 connects to capacitor 428 and to ground through resistor R4 438. A reference voltage for the comparator, Vref 414 also connects to common mode voltage detector circuit 408.

Figure 5:
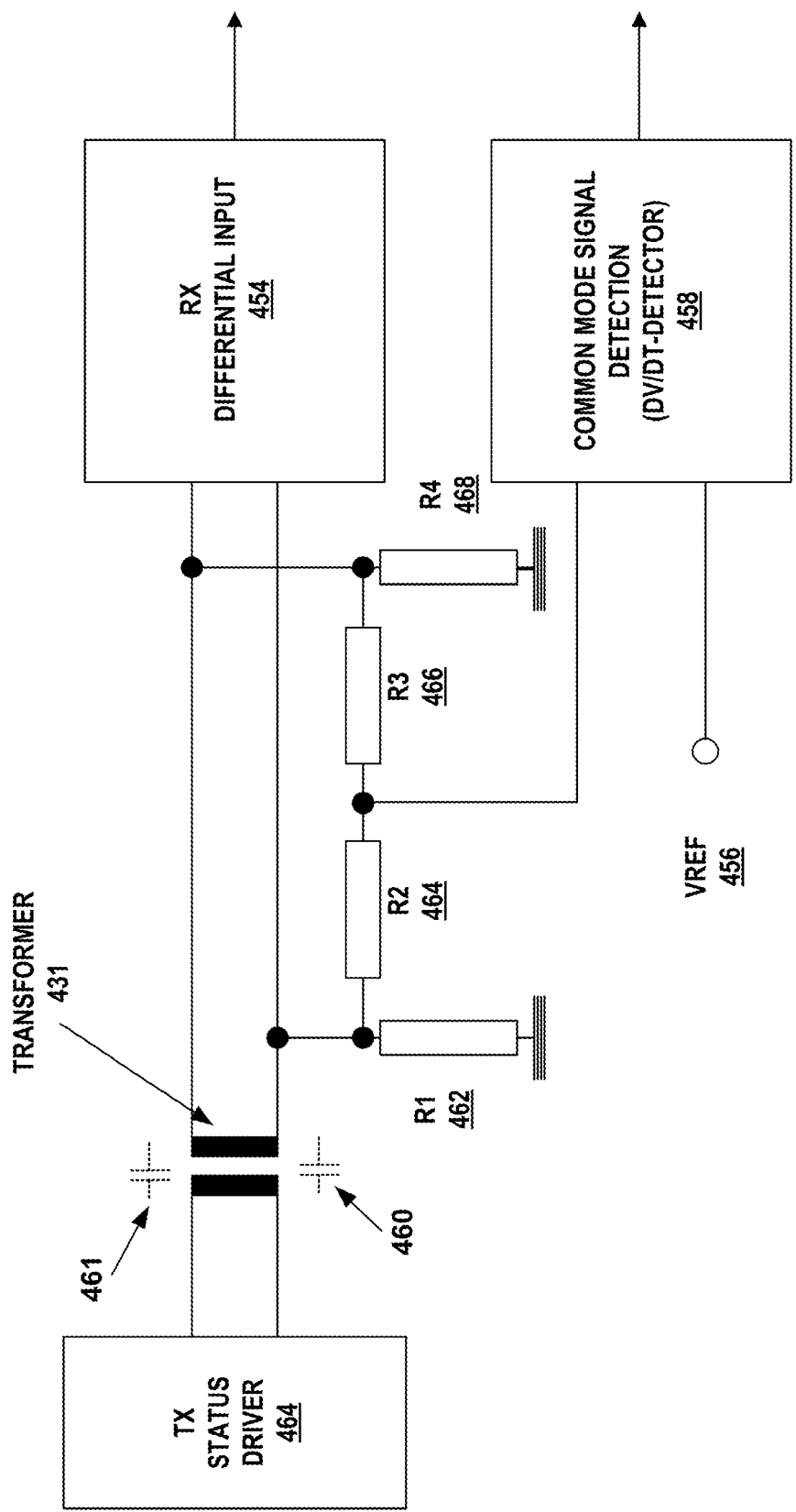
FIG. 5 is a schematic and block diagrams illustrating an example common mode detector circuit for use with a single transformer, according to one or more techniques of this disclosure.

FIG. 5 is a schematic and block diagrams illustrating an example communication and common mode detector circuit for use with a single transformer, according to one or more techniques of this disclosure. The circuit of FIG. 5 is an example of the data transfer circuit described above in relation to FIGS. 1-3C, but with galvanic isolation from the differential transformer replaced by single transformer 431. Similar to the capacitive isolation circuit of FIGS. 4A and 4B, without the center tap from the differential transformer the circuit of FIG. 5 includes a resistor divider. Also, similar to the differential transformer from FIGS. 2-3C, the coupling component for communication across the galvanic isolation is a parasitic capacitor from the parasitic capacitance between the transformer coils, indicated by capacitors 460 and 461.

RX differential input 454 is an example of the digital communication interface circuitry operationally connected to the controller (not shown in FIG. 5) as described above in relation to FIGS. 2-4B. Similar to the example of FIG. 4B, the input to common mode voltage detector circuit 458 of FIG. 5 connects to a node between resistors R2 464 and R3 466. The opposite terminal for R2 464 connects to a first terminal for the secondary coil of transformer 431, and to ground through resistor R1 462. as described for FIG. 4B, the local ground may be GND1 or GND2. The opposite terminal for R3 466 connects to a second, opposite terminal for the secondary coil of transformer 431, and to the local ground through resistor R4 468. A reference voltage, Vref 454 also connects to common mode voltage detector circuit 458.

Figure 6:
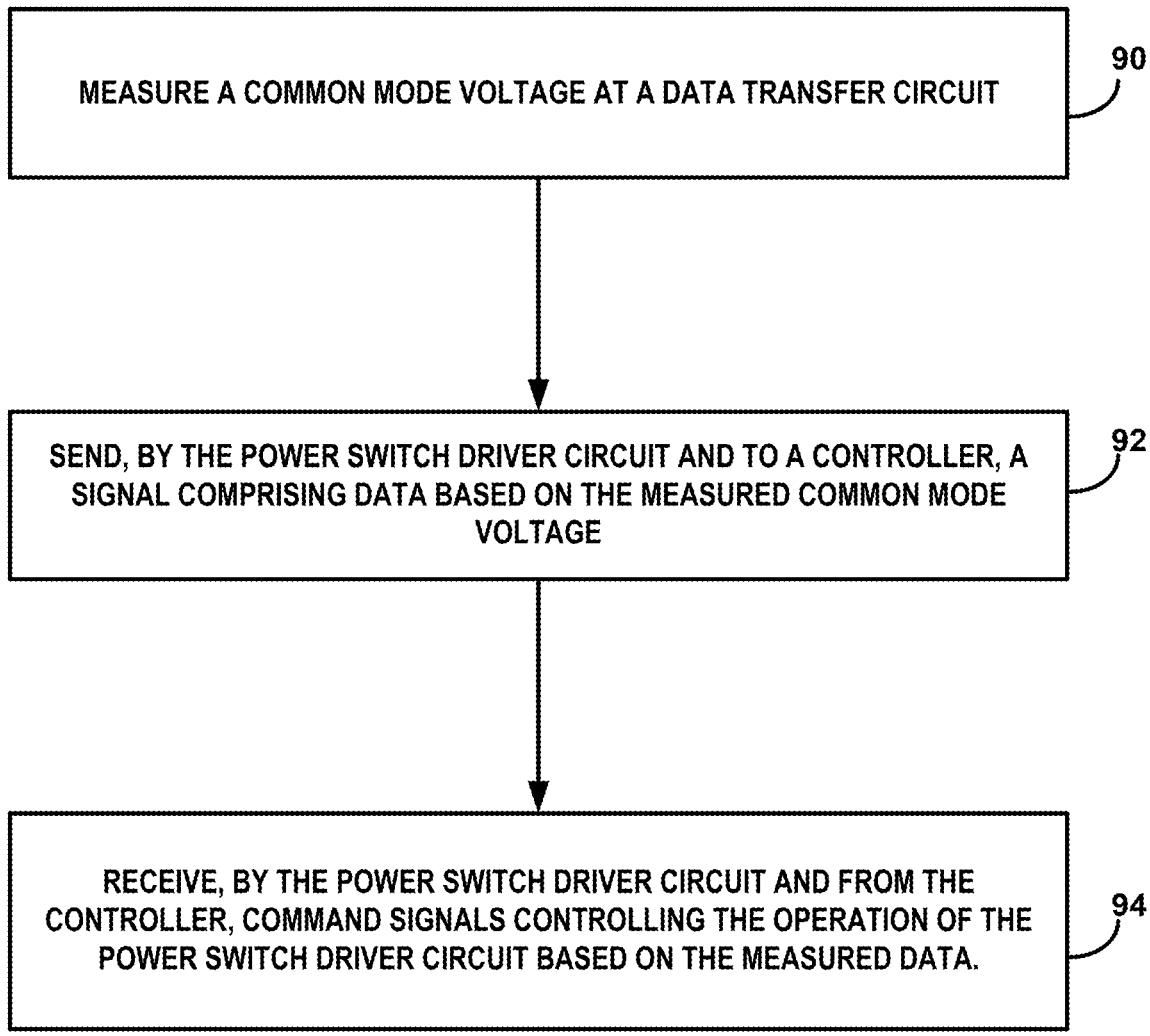
FIG. 6 is a flow chart illustrating an example operation of a system of this disclosure.

FIG. 6 is a flow chart illustrating an example operation of a system of this disclosure. The blocks of FIG. 6 will be described in terms of FIG. 2, unless otherwise noted. A common mode detector circuit in power switch driver unit 204 measures a common mode voltage at data transfer circuit 225 (90). As described above in relation to FIGS. 1-5, the data transfer circuit is configured to communicate across a galvanic isolation barrier using a coupling component, e.g., a parasitic capacitance in the example of data transfer circuit 225.

Data transfer circuit 225 of power switch driver unit 204 may send to controller 202, data based on the measured common mode voltage (92). As described above in relation to FIG. 3, the common mode voltage detector circuit of this disclosure, e.g., circuit 314 may take advantage of the unavoidable common mode voltages caused by the coupling capacitances of the data transfer circuit to evaluate the common mode voltage characteristics of a switching event, such as the slew rate.

Controller 202 may calculate an estimate for any of motor torque and current consumed, peak slew rate, average slew rate and other characteristics of the switching operation of power switch driver unit 204 based on the received data from data transfer circuit 225, including a voltage magnitude, or a time of peak voltage. In some examples controller 202 may also calculate an estimate of accelerated aging for one or more components of the system based on data received from the common mode voltage detector circuit. In some examples, e.g., a switching circuit such as switching circuit 206 with high-side and low-side switches, controller 202 may also adjust operation of the power switch driver circuitry to adapt a duration of dead-time between high-side and low-side switches driven by the power switch driver unit 204 or the control scheme for charging and discharging the control terminals (gates) of the power switches.

In some examples programming instructions executed by processing circuitry of controller 202, or of logic and signal conditioning circuitry 220, may cause either of controller 202 or circuitry 220 to determine that the operation of switches 206 needs to be adjusted, e.g., to change motor speed or torque, to reduce potential EMI, to manage an over-voltage or over-temperature warning, or for some other reason based on the measured data. Controller 202 may output switching commands and/or configuration commands received by power switch driver unit 204 (94). The commands, in the form of command signals, may control the operation of the power switch driver circuit.

In one or more examples, the functions described above may be implemented in hardware, software, firmware, or any combination thereof. For example, the various components of FIGS. 1 and 2, such as controller 202, logic and signal conditioning circuitry 220, may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described.

The techniques of this disclosure may also be described in the following clauses.

Clause 1: A circuit comprising: power switch driver circuitry including: galvanic isolation, including a coupling component; on a first side of the galvanic isolation, first connections configured to operatively connect to a controller; and on a second side of the galvanic isolation, second connections configured to operatively connect to a power switch control terminal; a data transfer circuit comprising: measure characteristics of a common mode voltage at the data transfer circuit, wherein the common mode voltage is a result of a switching event of a power switch controlled by the power switch control terminal.

Clause 2: The circuit of clause 1, wherein the characteristics of the common mode voltage indicate one or more of: a slew rate, a time of peak slew rate, a slew rate over time, and a time of the switching event.

Clause 3: The circuit of any of clauses 1 and 2, wherein the galvanic isolation barrier is a differential transformer comprising a parasitic capacitor, and wherein an input terminal of the common mode detector circuit connects to a center tap of the differential transformer.

Clause 4: The circuit of any of clauses 1 through 3, wherein the common mode voltage detector circuit comprises: a peak detector, and one or more filter structures.

Clause 5: The circuit of clause 4, wherein the peak detector comprises: circuitry configured to detect common mode voltage in a positive direction; and circuitry configured to detect common mode voltage in a negative direction.

Clause 6: The circuit of any of clauses 1 through 5, further comprising: a resistive divider circuit; the common mode voltage detector circuit connected to the resistor divider circuit; and to one or more filter structures.

Clause 7: The circuit of clause 6, wherein the galvanic isolation comprises at least two capacitors configured to create the galvanic isolation, and wherein the coupling component comprises the at least two capacitors.

Clause 8: The circuit of any of clauses 6 and 7, wherein the galvanic isolation comprises a single transformer.

Clause 9: A system comprising: a controller including processing circuitry; and power switch driver circuitry comprising: galvanic isolation, including a coupling component; on a first side of the galvanic isolation, first connections configured to operatively connect to the controller; and on a second side of the galvanic isolation, second connections configured to operatively connect to a power switch control terminal; a data transfer circuit comprising: the coupling component, the coupling component configured to conduct communication between the first side and the second side of the galvanic isolation; and a common mode voltage detector circuit, wherein the common mode detector circuit is configured to: measure characteristics of a common mode voltage at the data transfer circuit, wherein the common mode voltage is a result of a switching event of a power switch controlled by the power switch control terminal.

Clause 10: The system of clause 9, wherein the common mode detector circuit is further configured to output a signal to the controller comprising data based on the measured characteristics of the common mode voltage.

Clause 11: The system of clause 10, wherein the controller is configured to adjust operation of the power switch driver circuitry based on received data from the common mode voltage detector circuit, wherein the received data comprises a switching speed of the switching event, and wherein to adjust operation of the power switch driver circuitry comprises to change a configuration for the switching speed of the power switch driver circuit.

Clause 12: The system of any of clauses 10 and 11, further comprising a motor, wherein the controller is configured to calculate an estimate for one or more of: motor torque, a voltage magnitude, a time of peak voltage and current consumed based on the data of the common mode voltage.

Clause 13: The system of any of clauses 10 through 12, wherein the controller is configured to calculate an estimate of accelerated aging for one or more components of the system based on data received from the common mode voltage detector circuit.

Clause 14: The system of any of clauses 9 through 13, wherein the common mode detector circuit is configured to output data based on the measured characteristics of the common mode voltage to processing circuitry of the power switch driver circuitry, and wherein the processing circuitry is configured to adjust the operation of the power switch driver circuitry based on the data.

Clause 15: The system of any of clauses 9 through 14, wherein the common mode detector circuit comprises: a peak detector; and one or more filter structures.

Clause 16: The system of any of clauses 9 through 15, wherein the power switch comprises a high-side power switch, and wherein to adjust operation of the power switch driver circuitry comprises to adapt a duration of dead-time between high-side and low-side switches driven by the power switch driver circuit.

Clause 17: A method comprising: measuring a common mode voltage at a data transfer circuit of a power switch driver circuit, wherein the data transfer circuit is configured to communicate across a galvanic isolation boundary, wherein the galvanic isolation boundary isolates a first side of a power switch driver circuit from a second of the power switch driver circuit wherein the first side of the power switch driver circuit connects to a controller comprising processing circuitry, and wherein the second side of the power switch driver circuit connects to a power switch; sending, by the power switch driver circuit, a signal comprising data based on the measured common mode voltage; and controlling, by the power switch driver circuit, operation of the power switch driver circuit based on the data.

Clause 18: The method of clause 17, wherein the common mode voltage is a result of a switching event of a power switch controlled by the power switch driver circuit; wherein the data based on the measured common mode voltage comprises characteristics of the common mode voltage indicate one or more of: a slew rate, a time of peak slew rate, a slew rate over time, and a time of the switching event.

Clause 19: The method of any of clauses 17 and 18, wherein the power switch provides power to an electric motor, the method further comprising a motor, wherein the controller is configured to calculate an estimate for one or more of: motor torque, a voltage magnitude, a time of peak voltage and current consumed based on the received data of the common mode voltage.

Clause 20: The method of any of clauses 17 through 19, further comprising: adjusting the operation of the power switch driver circuitry based on received data from the common mode voltage detector circuit, wherein the data further indicates a switching speed of the switching event, and wherein to adjust operation of the power switch driver circuitry comprises to change a configuration for switching speed of the power switch driver circuit.

Various examples of the disclosure have been described. These and other examples are within the scope of the following claims.

What is claimed is:

1. A circuit comprising:
power switch driver circuitry including:
   galvanic isolation, including a coupling component;
   on a first side of the galvanic isolation, first connections configured to operatively connect to a controller on the first side of the galvanic isolation; and
   on a second side of the galvanic isolation, second connections configured to operatively connect to a power switch control terminal;
   a data transfer circuit comprising the coupling component, the coupling component configured to conduct communication between the first side and the second side of the galvanic isolation; and
   a common mode voltage detector circuit, wherein the common mode detector circuit is configured to:
      measure characteristics of a common mode voltage at the data transfer circuit, wherein the common mode voltage is a result of a switching event of a power switch controlled by the power switch control terminal and
      output a signal to the controller on the first side of the galvanic isolation, wherein the signal output to the controller comprises data based on the measured characteristics of the common mode voltage and wherein the controller is configured to control the power switch driver circuitry based on the signal.

2. The circuit of claim 1, wherein the characteristics of the common mode voltage indicate one or more of: a slew rate, a time of peak slew rate, a slew rate over time, and a time of the switching event.

3. The circuit of claim 1,
wherein the galvanic isolation comprises a barrier that includes a differential transformer comprising a parasitic capacitor, and
wherein an input terminal of the common mode detector circuit connects to a center tap of the differential transformer.

4. The circuit of claim 1, wherein the common mode voltage detector circuit comprises: a peak detector, and one or more filter structures.

5. The circuit of claim 4, wherein the peak detector comprises:
circuitry configured to detect common mode voltage in a positive direction; and
circuitry configured to detect common mode voltage in a negative direction.

6. The circuit of claim 1, further comprising:
a resistive divider circuit;
the common mode voltage detector circuit connected to the resistive divider circuit; and to one or more filter structures.

7. The circuit of claim 6,
wherein the galvanic isolation comprises at least two capacitors configured to create the galvanic isolation, and
wherein the coupling component comprises the at least two capacitors.

8. The circuit of claim 6, wherein the galvanic isolation comprises a single transformer.

9. A system comprising:
a controller including processing circuitry; and
power switch driver circuitry comprising:
   galvanic isolation, including a coupling component;
   on a first side of the galvanic isolation, first connections configured to operatively connect to the controller on the first side of the galvanic isolation; and
   on a second side of the galvanic isolation, second connections configured to operatively connect to a power switch control terminal;
   a data transfer circuit comprising the coupling component, the coupling component configured to conduct communication between the first side and the second side of the galvanic isolation; and
   a common mode voltage detector circuit, wherein the common mode detector circuit is configured to:
      measure characteristics of a common mode voltage at the data transfer circuit, wherein the common mode voltage is a result of a switching event of a power switch controlled by the power switch control terminal; and
      output a signal to the controller on the first side of the galvanic isolation, wherein the signal output to the controller comprises data based on the measured characteristics of the common mode voltage and wherein the controller is configured to control the power switch driver circuitry based on the signal.

10. The system of claim 9,
wherein the controller is configured to adjust operation of the power switch driver circuitry based on received data from the common mode voltage detector circuit,
wherein the received data comprises a switching speed of the switching event, and
wherein to adjust operation of the power switch driver circuitry, the controller is configured to change a configuration for the switching speed of the power switch driver circuitry.

11. The system of claim 9, further comprising a motor, wherein the controller is configured to calculate an estimate for one or more of: motor torque, a voltage magnitude, a time of peak voltage and current consumed based on the data of the common mode voltage.

12. The system of claim 9, wherein the controller is configured to calculate an estimate of accelerated aging for one or more components of the system based on data received from the common mode voltage detector circuit.

13. The system of claim 9,
wherein the common mode detector circuit is configured to output data based on the measured characteristics of the common mode voltage to processing circuitry of the power switch driver circuitry, and
wherein the processing circuitry is configured to adjust the operation of the power switch driver circuitry based on the data.

14. The system of claim 9, wherein the common mode detector circuit comprises: a peak detector; and one or more filter structures.

15. The system of claim 9,
wherein the power switch comprises a high-side power switch, and
wherein to adjust operation of the power switch driver circuitry comprises to adapt a duration of dead-time between high-side and low-side switches driven by the power switch driver circuitry.

16. A method comprising:
measuring a common mode voltage at a data transfer circuit of a power switch driver circuit,
   wherein the data transfer circuit is configured to communicate across a galvanic isolation boundary, wherein the galvanic isolation boundary isolates a first side of a power switch driver circuit from a second of the power switch driver circuit wherein the first side of the power switch driver circuit connects to a controller comprising processing circuitry, and wherein the second side of the power switch driver circuit connects to a power switch;

outputting, by the power switch driver circuit, a signal to the controller on the first side of the galvanic isolation, wherein the signal output to the controller comprises data based on the measured characteristics of the common mode voltage;

and controlling, by the power switch driver circuit, operation of the power switch driver circuit based on the data.

17. The method of claim 16, wherein the common mode voltage is a result of a switching event of the power switch controlled by the power switch driver circuit;

wherein the data based on the measured common mode voltage comprises characteristics of the common mode voltage indicate one or more of: a slew rate, a time of peak slew rate, a slew rate over time, and a time of the switching event.

18. The method of claim 16, wherein the power switch provides power to an electric motor, the method further comprising calculating, by the controller, an estimate for one or more of: motor torque, a voltage magnitude, a time of peak voltage and current consumed based on the received data of the common mode voltage.

19. The method of claim 16, further comprising:

adjusting the operation of the power switch driver circuit based on the data received from the power switch driver circuit, wherein the data further indicates a switching speed of a switching event, and wherein adjusting operation of the power switch driver circuitry comprises changing a configuration for switching speed of the power switch driver circuit.

* * * * *